United States Patent
DiStefano

(10) Patent No.: US 7,166,326 B1
(45) Date of Patent: Jan. 23, 2007

(54) METHOD OF ELECTROPLATING STRESSED METAL SPRINGS

(75) Inventor: Thomas H. DiStefano, Monte Sereno, CA (US)

(73) Assignee: Palo Alto Research Center (PARC), Palo Alto, CA (US)

( * ) Notice: Subject to any disclaimer, the term of this patent is extended or adjusted under 35 U.S.C. 154(b) by 0 days.

(21) Appl. No.: 11/012,526

(22) Filed: Dec. 14, 2004

(51) Int. Cl.
*B21D 26/02* (2006.01)
*B05D 3/00* (2006.01)

(52) U.S. Cl. .................... 427/270; 427/373; 427/383.1
(58) Field of Classification Search ................ 427/258, 427/270, 271, 273, 348, 349, 372.2, 383.1, 427/373; 29/896.9, 421.1, DIG. 3, 23; 72/38, 72/46, 54, 56, 703
See application file for complete search history.

(56) References Cited

U.S. PATENT DOCUMENTS

| | | | | |
|---|---|---|---|---|
| 5,665,648 A * | 9/1997 | Little | ......................... | 438/117 |
| 5,763,941 A | 6/1998 | Fjelstad | ...................... | 257/669 |
| 5,904,498 A | 5/1999 | Fjelstad | ...................... | 438/106 |
| 6,264,477 B1 | 7/2001 | Smith et al. | .................. | 439/66 |
| 6,357,112 B1 | 3/2002 | DiStefano et al. | ............ | 29/843 |
| 6,361,959 B1 | 3/2002 | Beroz et al. | .................. | 435/14 |
| 6,488,803 B2 | 12/2002 | Kiuchi et al. | | |
| 6,541,845 B2 | 4/2003 | Beroz et al. | ................ | 257/669 |
| 6,676,896 B1 * | 1/2004 | Baumeister | .................. | 419/61 |

OTHER PUBLICATIONS

Nitto Denko America: REVALPHA thermal release tape © 2001-2006 Nitto Denko-Corporation URL http://www.nittousa.com/products/electronic/revalpha.php.
Nitto Denko America: Tape ELEP holder for protection or fixing of semiconducting wagers in the backgrind process © 2001-2006 Nitto Denko-Corporation URL http://www.nittousa.com/products/electronic/elep_back.php.
Nitto Denko America: Tape ELEP holder for protection or fixing semiconducting wagers in the dicing process © 2001-2006 Nitto Denko-Corporation URL http://www.nittousa.com/products/electronic/elep_dice.php.

* cited by examiner

*Primary Examiner*—William Phillip Fletcher, III
(74) *Attorney, Agent, or Firm*—Kent Chen

(57) ABSTRACT

A novel method of forming a released metal spring structure is described. In the method, a release layer including a blowing agent is deposited, usually printed, over portions of a substrate. A metal film is deposited over both the release layer and the substrate. The release layer is then heated such that the blowing agent decomposes releasing a portion of the metal film. The metal film curls out of the plane of the substrate to form a spring structure.

16 Claims, 3 Drawing Sheets

METHOD OF ELECTROPLATING STRESSED METAL SPRINGS

BACKGROUND

As electronic component densities increase and the components are reduced in size, interconnect structures that connect the components have failed to undergo a corresponding size reduction. In response, novel interconnect mechanisms have been developed including the use of stressed metal spring technology as described in U.S. patent application Ser. No. 10/997,931 entitled "A Latching Structure and a Method of Making an Electrical Interconnect", which is hereby incorporated by reference.

Stressed metal springs fabrication is expensive. During spring fabrication, a stressed metal is deposited over a release layer. Formation of the release layer is a complicated process that substantially increases costs. Resist layer deposition involves a photolithographic process that includes resist coating, baking, photoprinting and developing, usually under vacuum conditions. Wet etching the release layer releases stress metal deposited over the release layer. Release layer residue is then stripped and cleaned.

Although the described processing technique results in robust structures, vacuum processing techniques are expensive. The high cost makes stressed metal spring structures impractical some for low cost applications. For very low cost applications, even the several layer deposition of stressed metal may be considered expensive.

Thus, an inexpensive technique for forming a spring structure, particularly one suitable for interconnecting electronic devices is needed.

SUMMARY

A method of forming a spring structure is described. A blowing agent is deposited over a substrate. A releasable portion of a metal layer is deposited over the blowing agent and a non-releasable portion of the metal layer adheres to the substrate. The structure is heated until the blowing agent releases the releasable portion of the metal. A force curls the releasable portion of the metal out of the plane of the substrate to form a spring structure.

DETAILED DESCRIPTION

An improved method and structure for creating a spring structure is described. The structure uses a release material including a blowing agent that decomposes above a critical temperature. The release material affixes a portion of a metal strip to a substrate. When heated above a critical temperature, the blowing agent decomposes and releases a portion of the metal strip which curls to form a spring structure.

Figure 1:
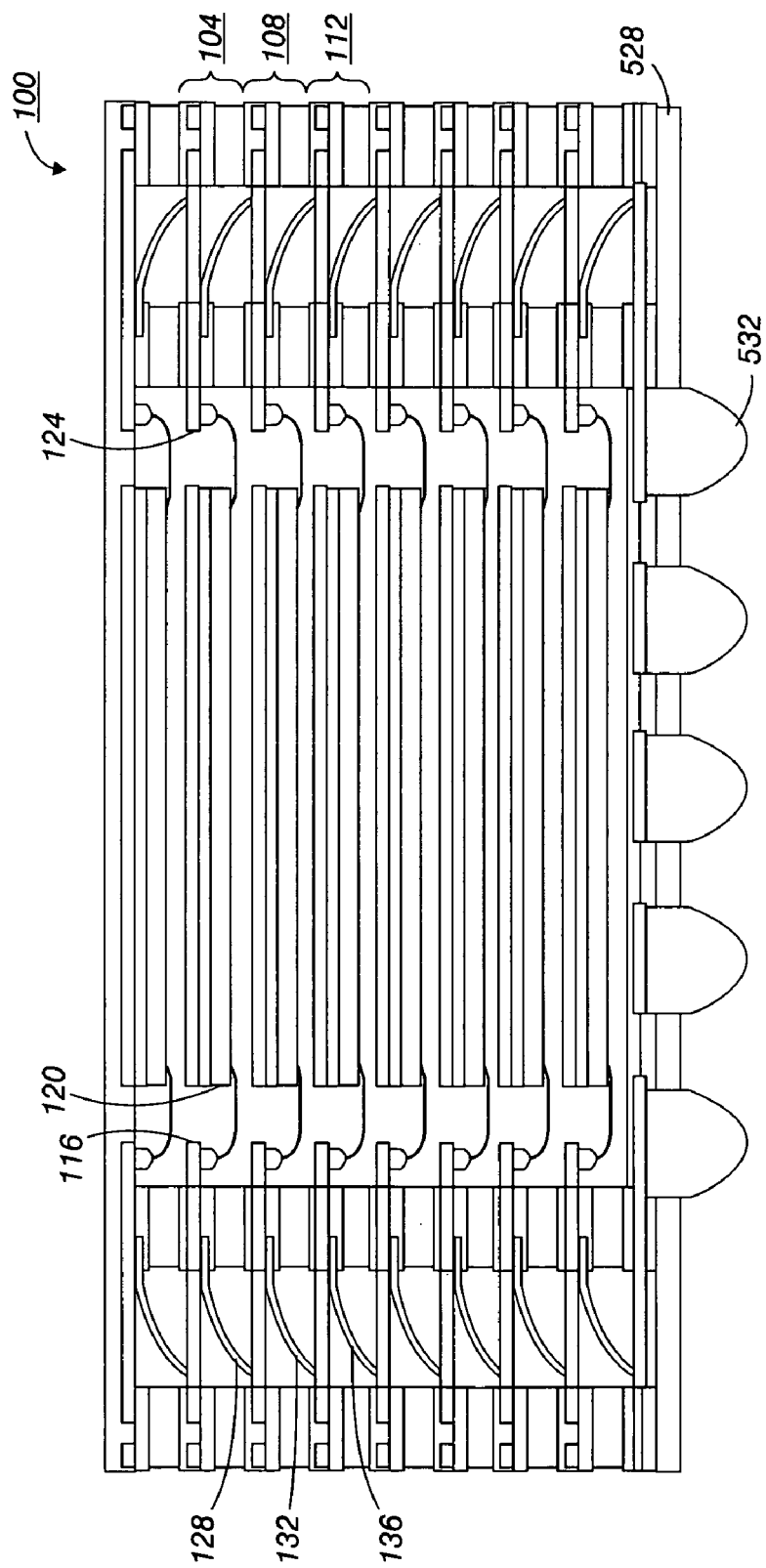
FIG. 1 shows a stacked interconnect structure that provides one use for the spring structure being fabricated.

FIG. 1 shows an example stacked structure that may be formed using the process described. The stacked structure 100 includes a plurality of layers 104, 108, 112. Each layer includes a corresponding circuit 116, 120, 124. A plurality of spring interconnects 128, 132, 136 electrically couple the circuits in each layer 104, 108, 112 with circuitry in adjacent layers. The illustrated stacked structure is described in U.S. patent application Ser. No. 10/729,557 entitled "Thin Package For Stacking Integrated Circuits" filed Dec. 2, 2004 by the same inventors which is hereby incorporated by reference in its entirety.

Although the described method for forming a spring structure is applicable for many different applications, the following description will be provided in the context of forming a single layer of the stacked structure. The example stacked structure provides context but should not be used to limit the broad applications of the techniques described herein.

Figure 2:
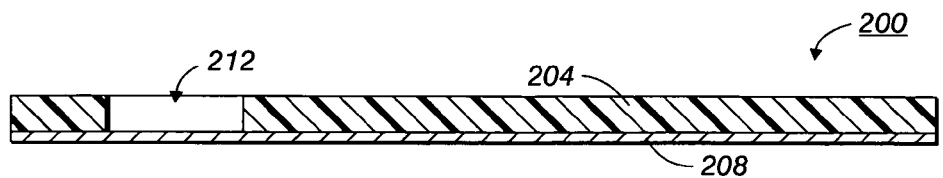
FIG. 2 shows a starting substrate.

FIG. 2 shows a starting substrate 200. The substrate may be made from a wide variety of materials. When the springs form circuit interconnect elements 128, 132, 136; substrate 200 is typically made from materials suitable for mounting integrated circuit components.

In FIG. 2, a polyimide film 204 forms the underlying base substrate. When used in a stacked structure, the polyimide film is typically thick enough to provide adequate structural support, but thin enough to avoid adding substantial bulk to the stacked structure. In stacked structures, polyimide film 204 is typically between 10 and 100 micrometers thick.

In the illustrated embodiment, substrate 200 includes a thin conducting layer 208 deposited over the base substrate or polyimide film 204. In one embodiment, a copper foil forms thin conducting layer 208. Thin conducting layer 208 may be laminated to the polyimide film. Thin conducting layers are useful when spring contacts will be used to make a backside contact to a stacked circuit structure. In particular, an opening 212 in the polyimide film 204 enables backside contact of thin conducting layer 208.

Figure 3:
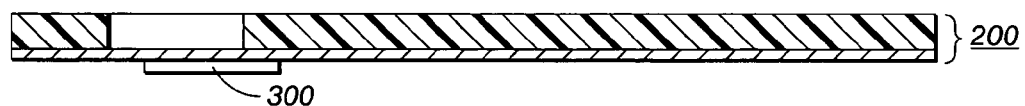
FIG. 3 shows the deposition of a release film including a blowing agent.

FIG. 3 shows a release material forming a release layer 300 deposited over a portion of substrate 200. Release material typically includes a blowing agent that decomposes when heated above a "trigger temperature". Upon decomposition, the solid blowing agent typically undergoes sublimation and coverts directly into gases such as nitrogen gas or carbon dioxide.

Most blowing agents are organic compounds. An example blowing agent, azodicarbonamide (AZ) decomposes into carbon dioxide, nitrogen and other gasses at temperatures above 205 degrees centigrade. Optimally, the trigger temperatures are selected to be above the water boiling point and below temperatures that damage electronic components. Typical trigger temperatures are between 140 degrees centigrade and 240 degrees centigrade.

Release material in release layer 300 also typically includes a matrix material that forms the thin film body. One example of a suitable matrix material is a polymer such as polymethylmethacrylate (PMMA) or polypropylene. When heated, the blowing agent in a PMMA matrix results in a brittle release layer that fractures resulting in release of the spring. In one embodiment, the force that causes curling of the spring is unrelated to the release material. Internal stresses in a stressed metal provide a typical force to curl the spring.

In an alternate embodiment, release material includes a foaming agent, such as polypropylene, which foams when heated. When the foaming agent triggers, the foaming action provides a force that lifts the releasable portion of the spring structure. In one embodiment, the foaming agent forms a closed cell foam that remains under the spring after fabrication. The closed cell foam acts as an air spring that provides additional resiliency to the total spring structure.

The polypropylene release material with a foaming agent foams and remains soft at temperatures above a "trigger temperature". When using a foaming agent, the blowing agent trigger temperature is selected to approximately match the foaming agent foaming temperature. Approximately matching foaming agent foaming temperature and the blowing agent critical temperature prevents foam free flow from enveloping and burying the spring in foam.

Many methods of depositing release layer 304 may be used. Deposition methods include jet printing, stencil printing and screen printing among others. One advantage of the various described printing methods is that a vacuum environment is unnecessary. Elimination of vacuum processing substantially reduces processing costs.

Release material viscosity should be matched to the deposition method used. When deposition is done by stencil printing, solvents are used to dissolve the release material prior to printing. An example solvent, MEK (methyl ethyl ketone), may be used to thin release material organic substances for printing. When fine features are to be stencil printed, a thickening agent, such as 2% by weigh of vinylated fumed silica may be added to increase the thixotropy of the mixture.

Screen printing also involves careful control of the release material viscosity. Again, organic solvents such as MEK are used to achieve desired viscosities. Below a viscosity of 10,000 cP to 80,000 cP, thickening agents may be added to increase thickness and forming properties of the release material. Although inexpensive stencil and screen printing viscosities have been described, it should be well understood that other deposition methods, such as jet printing and photolithographic deposition, may be used.

Figure 4:
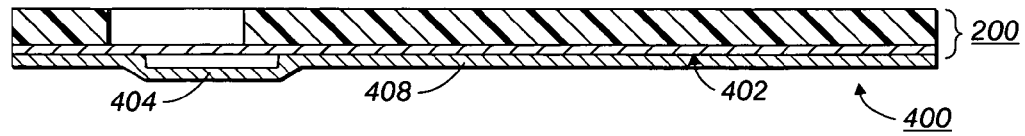
FIG. 4 shows a film, usually made of stressed metal, deposited over the release film and the substrate.

FIG. 4 shows film 400 deposited over substrate 200 and release layer 300. One method of depositing film 400 is by plating surface 402 with a metal such that metal film 400 forms. One portion, a "releasable portion" 404 of the metal overlays release layer 300 and a second portion of the metal, a "fixed portion" or nonreleasable portion 408, overlays substrate 200.

In one embodiment, metal film 400 is a stressed metal layer. Stressed metals may be formed by depositing layers of film such that differing layers have different tensions. In particular, the temperature or pressure during deposition is varied such that upper layers atoms in film 400 are less compressed than atoms in lower layers. The tension gradient may be created by increasing temperature as film 400 is deposited or by decreasing the atmospheric pressure surrounding the sample during film 400 deposition. When release layer 300 releases film 400, internal stress cause the film to curl out of the substrate plane. A detailed description of stressed metal formation is described in U.S. Pat. No. 5,613,861 by Don Smith entitled "Photolithographically Patterned Spring Contact" and also in U.S. Pat. No. 6,290,510 by David Fork et al. entitled "Spring Structure with Self-Aligned Release Material", both patents are hereby incorporated by reference in their entirety.

Figure 5:
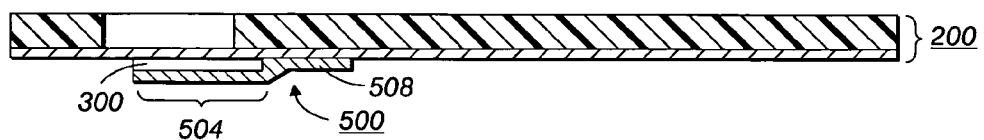
FIG. 5 shows the film after patterning including a releasable portion over the release film and a nonreleasable portion adhering to the substrate.

After film 400 deposition, the film may be patterned or etched to leave a remaining spring structure 500 as shown in FIG. 5. The patterning process removes film 400 from undesirable areas. In an alternative embodiment, during film 400 formation, deposition is controlled such that only material that forms spring structure 500 is deposited. For example, film 400 may be printed to form spring structure 500. Careful deposition avoids the need for a removal process. Regardless of formation method used, spring structure 500 includes "releasable portion" 504 positioned over release layer 300 and "fixed portion" 508 affixed to substrate 200.

The process of electroplating releasable layer 404 is facilitated by use of a conductive release layer 300. Incorporating a conductive material in release layer 300 provides one method of forming a conducting layer around spring structure 500. A conductive filler, such as carbon particles, is an example coating material that may be incorporated into release layer 300. A carbon fill of about 60% renders coating material electrically conductive. Carbon fillers with particle sizes ranging from 1 to 10 microns and commercially available from DeGusa provide excellent conductive coatings for spring structure 500. The electrically conductive material melting point is typically below the trigger temperature of the blowing agent. The lower melting point allows coating material melting and coating of spring structure 500 prior to release.

Figure 6:
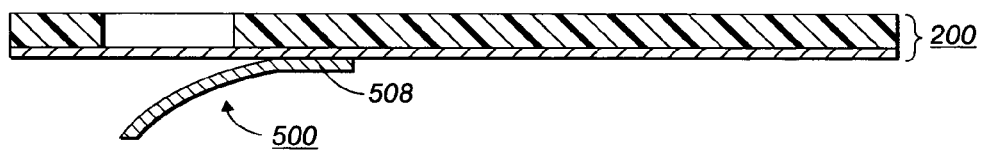
FIG. 6 shows a spring structure after a blowing agent in the release film is heated above a trigger temperature.

FIG. 6 shows spring structure 500 after heating release layer 300 above the trigger temperature. As previously described, above the trigger temperature, the blowing agent decomposes resulting in release of the release portion of spring structure 500. When spring structure 500 is a stressed metal, internal stresses force curling of spring structure 500 release portion 404 out of the plane of substrate 200

Figure 7:
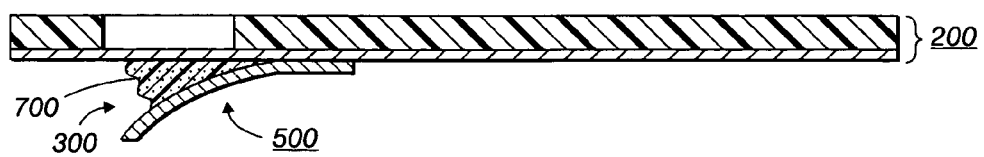
FIG. 7 shows a foam material that assists the spring action of the spring structure.

FIG. 7 shows an alternative spring structure 500 where release layer 300 includes a foaming agent such as polypropylene. When heated, the blowing agent in release layer 300 releases spring structure 500 releasable portions to form a released portion 504. In addition, the foaming agent forms foam structure 700. Foam structure 700 lifts released portion 504 of the spring structure. Foam structure 700 may also be a closed cell foam that provides resilience or springiness to released portion 504.

The resulting structures of FIG. 6 and FIG. 7 represent one spring structure in the stacked interconnect structure of FIG. 1. When the spring structures are coupled to electronic circuits and stacked, a stacked circuit structure as illustrated in FIG. 1 may be formed.

Although described in terms of the stacked interconnect structure, it should be understood that the methods and techniques described herein have broad applications. For example, the spring structure described may be used for printing or inductor structures as well as other interconnect architectures. Thus it should be under stood that the described structures and details including materials and device parameters are provided as examples to facilitate understanding and that the invention should not be so limited. Instead, the invention should be limited only be the claims, as originally presented and as they may be amended to encompass variations, alternatives, modifications, improvements, equivalents, and substantial equivalents of the embodiments and teachings disclosed herein, including those that are presently unforeseen or unappreciated, and that, for example, may arise from applicants/patentees and others.

What is claimed is:

1. A method of forming a spring structure comprising;
depositing a blowing agent over at least a portion of a substrate;

depositing a layer of metal, a releasable portion of the metal deposited over the blowing agent, a non-releasable portion of the metal adhering to the substrate;

heating the blowing agent to a temperature such that the blowing agent releases the releasable portion of the metal such that a force curls the releasable portion of the metal out of the plane of the substrate.

2. The method of claims 1 wherein upon heating the blowing agent decomposes and converts from a solid to a gas.

3. The method of claim 1 wherein the temperature at which the blowing agent releases the releasable portion of the metal is above 100 degrees centigrade.

4. The method of claim 3 wherein the temperature at which the blowing agent releases the releasable portion of the metal is below 400 degrees centigrade.

5. The method of claim 1 wherein the blowing agent is an organic compound.

6. The method of claim 5 wherein the blowing agent is azodicarbonamide.

7. The method of claim 1 wherein the blowing agent is mixed with a foaming agent.

8. The method of claim 7 wherein the foaming agent forms a closed cell foam that acts as an air spring under the releasable portion.

9. The method of claim 7 wherein the foaming agent is polypropylene.

10. The method of claim 7 wherein the foaming agent provides the force to curl the releasable portion of the metal out of the plane of the substrate.

11. The method of claim 1 wherein the metal is a stressed metal formed by depositing different layers and at different pressures or temperatures, the stressed metal having an internal stress that provides the force to cause the releasable portion of the metal to curl out of the plane of the substrate.

12. The method of claim 1 wherein the substrate is a metal layer deposited over a base substrate.

13. The method of claim 1 wherein the blowing agent is stenciled into place.

14. The method of claim 1 wherein the blowing agent is silk screened into place.

15. The method of claim 1 wherein the blowing agent is printed into place using ejected droplets of the blowing agent.

16. A method of forming a spring structure comprising:

depositing a blowing agent over at least a portion of a substrate;

depositing a layer of stressed metal, the stressed metal made by depositing different layers at different temperatures or pressures to create an internal stress gradient, a releasable portion of the stressed metal deposited over the blowing agent, a non-releasable portion of the stressed metal adhering to the substrate; and, heating the blowing agent to a temperature such that the blowing agent releases the releasable portion of the stressed metal such that a force curls the releasable portion of the stressed metal out of the plane of the substrate.

* * * * *